(12) United States Patent
Jeon

(10) Patent No.: US 9,054,518 B2
(45) Date of Patent: Jun. 9, 2015

(54) DISPLAY APPARATUS

(71) Applicant: SAMSUNG DISPLAY CO., LTD., Yongin, Gyeonggi-Do (KR)

(72) Inventor: Mu-Kyung Jeon, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/082,985

(22) Filed: Nov. 18, 2013

(65) Prior Publication Data
US 2014/0376136 A1 Dec. 25, 2014

(30) Foreign Application Priority Data

Jun. 21, 2013 (KR) .................. 10-2013-0071942

(51) Int. Cl.
*H02H 9/00* (2006.01)
*H02H 9/04* (2006.01)
*H02H 1/04* (2006.01)
*H02H 3/22* (2006.01)
*H02H 9/06* (2006.01)

(52) U.S. Cl.
CPC ...................................... *H02H 9/04* (2013.01)

(58) Field of Classification Search
CPC ................................ H02H 9/04; H02H 9/046
USPC ........................................................ 361/56
See application file for complete search history.

(56) References Cited

U.S. PATENT DOCUMENTS

| 7,893,441 | B2 | 2/2011 | Hong et al. | |
| 8,031,281 | B2 * | 10/2011 | Yang et al. | 349/40 |
| 2010/0315400 | A1 | 12/2010 | Choi et al. | |

FOREIGN PATENT DOCUMENTS

| KR | 10-2004-0063521 | 7/2004 |
| KR | 10-2008-0046891 | 5/2008 |
| KR | 10-2010-0074935 | 7/2010 |
| KR | 10-2010-0134290 | 12/2010 |

OTHER PUBLICATIONS

US Patent No. 7,896,441 (for KR 10-2010-0074935).
US Patent Application Publication No. (for KR 10-2010-0134290).

* cited by examiner

*Primary Examiner* — Dharti Patel
(74) *Attorney, Agent, or Firm* — F. Chau & Associates, LLC

(57) ABSTRACT

A display apparatus includes a display unit including a thin film transistor (TFT) and a display device. The display device is electrically connected to the TFT and displays an image. A circuit unit is disposed at a side of the display unit and includes a driving device or a signal line unit. The circuit unit includes a damage inducing unit electrically coupled to a conductor in the circuit unit. The damage inducing unit forcibly discharges an electrostatic discharge (ESD) introduced into the circuit unit, thus preventing damage to the driving device or the signal line unit due to the ESD.

19 Claims, 7 Drawing Sheets

DISPLAY APPARATUS

CROSS-REFERENCE TO RELATED PATENT APPLICATION

This application claims priority under 35 U.S.C. §119 to Korean Patent Application No. 10-2013-0071942, filed on Jun. 21, 2013, in the Korean Intellectual Property Office, the disclosure of which is incorporated by reference herein in its entirety.

TECHNICAL FIELD

Exemplary embodiments of the present invention relate to a display apparatus, and more specifically, to removal of an ESD that occurs in a display apparatus.

DISCUSSION OF THE RELATED ART

Display apparatuses such as liquid crystal display apparatuses or organic light-emitting display apparatuses may be damaged by electrostatic discharge (ESD) upon or after manufacture thereof, and thus, image quality may be deteriorated.

SUMMARY

According to an exemplary embodiment of the present invention, a display apparatus includes a display unit including a thin film transistor (TFT). A display device is electrically connected to the TFT and displays an image. A circuit unit is disposed at a side of the display unit and includes a driving device or a signal line unit. The circuit unit includes a damage inducing unit electrically coupled to a conductor in the circuit unit. The damage inducing unit forcibly discharges electrostatic discharge (ESD) introduced into the circuit unit, thus preventing damage to the driving device or the signal line unit due to the ESD.

The driving device or the signal line unit may include a contact area.

The damage inducing unit may be disposed at an edge of the circuit unit.

The damage inducing unit may include a plurality of stacked conductive layers. An insulating layer has a contact hole. The insulating layer is interposed between the plurality of conductive layers. The plurality of conductive layers is connected to one another via the contact hole to form a contact area. The contact area is likely to be damaged by the ESD.

Some of the plurality of conductive layers may be formed on the same layer as a gate electrode of the TFT.

The TFT may include a driving TFT for driving the display device and a switching TFT. One of the plurality of conductive layers includes the same material as a gate electrode of the driving TFT and the other one of the plurality of conductive layers includes the same material as a gate electrode of the switching TFT.

One of the plurality of the conductive layers may include the same material as a source electrode or a drain electrode of the TFT.

The damage inducing unit may further include a protrusion that guides the ESD to the damage inducing unit.

The damage inducing unit may include a first conductive layer. A second conductive layer is formed on the first conductive layer. A first insulating layer is interposed between the first conductive layer and the second conductive layer. A third conductive layer is formed on the second conductive layer. A second insulating layer is interposed between the second conductive layer and the third conductive layer. The third conductive layer is connected to the first conductive layer and the second conductive layer via contact holes to form a contact area.

The damage inducing unit may be connected to the conductor. The conductor is formed on the same layer as the first conductive layer or the second conductive layer.

The damage inducing unit may further include a protrusion formed on the same layer as one of the first through third conductive layers. The protrusion guides the ESD to the damage inducing unit.

The damage inducing unit may include a first damage inducing unit and a second damage inducing unit that are respectively disposed on both sides of the conductor in a direction substantially perpendicular to a length direction of the conductor. The conductor is disposed between the first and second inducing units.

According to an exemplary embodiment of the present invention, a display apparatus includes a display unit that includes a switching thin film transistor (TFT), a driving TFT, and an organic display device electrically connected to the driving TFT. The display unit displays an image. A circuit unit is disposed adjacent to the display unit and includes a driving device or a signal line unit. The circuit unit includes a damage inducing unit. The damage inducing unit forcibly discharges an electrostatic discharge (ESD) introduced into the circuit unit, thus preventing damage to the driving device or the signal line unit due to the ESD.

The driving device or the signal line unit may include a contact area.

The contact area of the driving device or the signal line unit may be disposed in the circuit unit. The damage inducing unit may be disposed at an edge of the circuit unit.

The damage inducing unit may be disposed at a first side adjacent to the display unit and/or a second side that is away from the display unit.

The damage inducing unit may further include a protrusion that guides the ESD to the damage inducing unit.

The damage inducing unit may include a first conductive layer. A first insulating layer is formed on the first conductive layer. A second conductive layer is formed on the first insulating layer. A second insulating layer is formed on the second conductive layer. A third conductive layer is formed on the second insulating layer. The third conductive layer is connected to the first conductive layer via a first contact hole that passes through the first and second insulating layers to form a first contact area. The third conductive layer is connected to the second conductive layer via a second contact hole that passes through the second insulating layer to form a second contact area.

The first through third conductive layers may include a metal.

One of the first and second conductive layers may be formed on the same layer as a gate electrode of the driving TFT, and the other of the first and second conductive layers may be formed on the same layer as a gate electrode of the switching TFT.

One of the first and second conductive layers may include the same metal as a gate electrode of the driving TFT, and the other of the first and second conductive layers may include the same metal as a gate electrode of the switching TFT.

According to an exemplary embodiment of the present invention, a display apparatus comprises a display unit configured to display an image. A circuit unit is disposed at a side of the display unit. The circuit unit is connected to the display unit. The circuit unit includes a switching element and a signal line. A damage inducing unit is connected to the switching element via the signal line. The damage inducing unit comprises a first conductive layer, a second conductive layer that does not overlap the first conductive layer, and a third conductive layer connecting the first conductive layer with the second conductive layer.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION OF EMBODIMENTS

Figure 1:
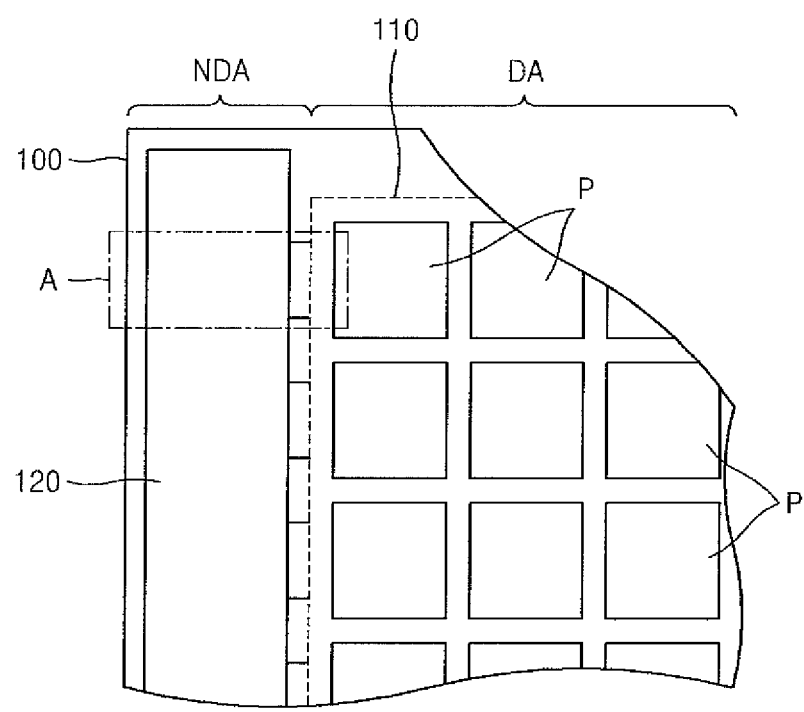
FIG. 1 is a top view illustrating a portion of a display apparatus according to an exemplary embodiment of the present invention.

Hereinafter, exemplary embodiments of the inventive concept will be described in detail with reference to the accompanying drawings. The inventive concept, however, may be modified in various different ways, and should not be construed as limited to the embodiments set forth herein.

Like reference numerals may denote like or similar elements throughout the specification and the drawings. When an element is referred to as being "on," "connected to," "coupled to," or "adjacent to" another portion, it can be directly on, connected, coupled, or adjacent to the other portion, or intervening elements may be present.

Figure 2:
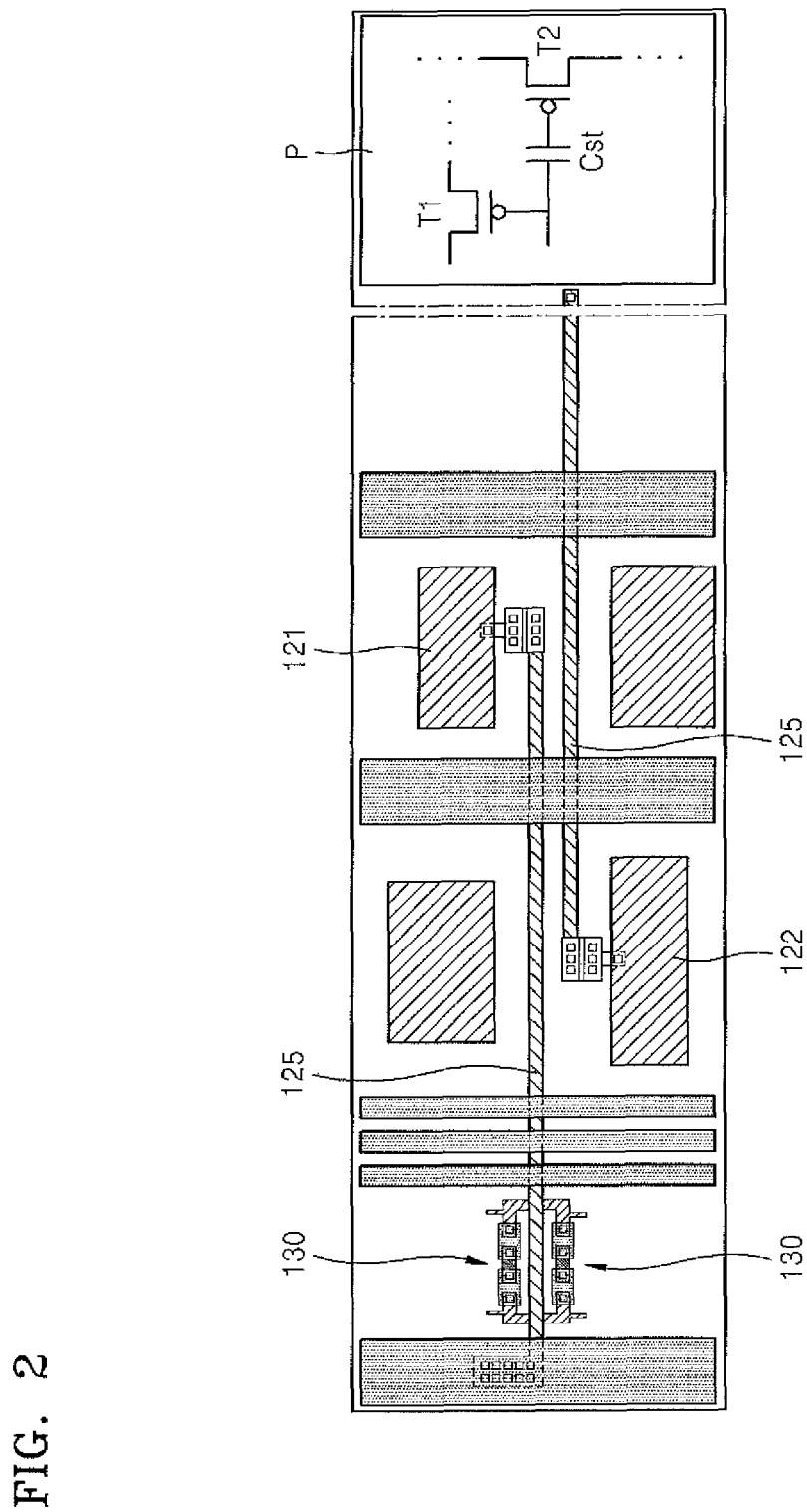
FIG. 2 is a top view illustrating portion A of a display apparatus illustrated in FIG. 1, according to an exemplary embodiment of the present invention.
Figure 3:
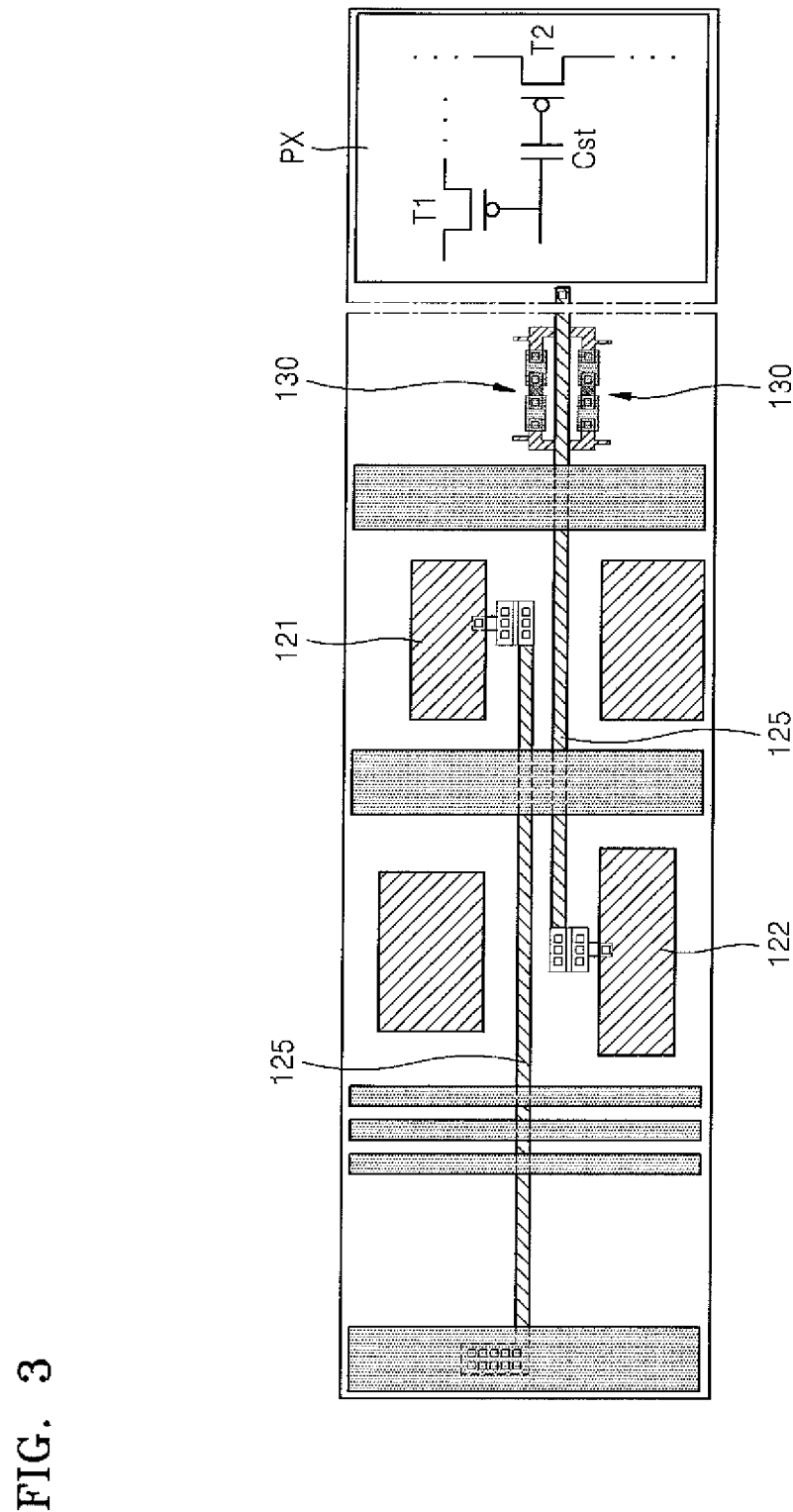
FIG. 3 is a top view illustrating portion A of a display apparatus illustrated in FIG. 1, according to an exemplary embodiment of the present invention.

FIG. 1 is a top view illustrating a portion of a display apparatus according to an exemplary embodiment of the present invention. FIG. 2 is a top view illustrating portion A of a display apparatus illustrated in FIG. 1, according to an exemplary embodiment of the present invention. FIG. 3 is a top view illustrating portion A of a display apparatus illustrated in FIG. 1, according to an exemplary embodiment of the present invention.

Referring to FIG. 1, the display apparatus may include a display substrate 100 and an encapsulation substrate. The display substrate 100 includes a display unit 110 for displaying an image and a circuit unit 120 for driving a plurality of pixels P included in the display unit 110. The circuit unit 120 is formed in a non-display area NDA disposed at a side of the display unit 110. The circuit unit 120 is disposed on the left side of the display unit 110 as shown in FIG. 1. Alternatively, the circuit unit 120 may be disposed at the right side of the display unit 110. Circuit units 120 may be disposed at the left and right sides, respectively, of the display unit 110. The circuit unit 120 may be disposed at an upper side of the display unit 110.

An encapsulation member that surrounds the display unit 110 may be disposed on an outer portion of the non-display area NDA. The encapsulation member allows the encapsulation substrate to be attached to the display unit. The encapsulation substrate encapsulates the display unit 110 from the external air. The circuit unit 120 together with the display unit 110 is also encapsulated. The display substrate 100 faces the encapsulation substrate. Alternatively, when the encapsulation substrate is a thin encapsulation film including organic and inorganic layers, the encapsulation member may be omitted.

The display unit 110 is where an image is displayed. The display unit 110 includes a plurality of pixels P where gate lines and data lines cross each other. Each pixel P includes an organic light-emitting device that emits light having a luminance corresponding to a driving current corresponding to a data signal and a pixel circuit that controls the driving current flowing through the organic light-emitting device. The pixel circuit may be connected to each of the gate lines and each of the data lines. The pixel circuit is also connected to the organic light-emitting device.

Referring to FIGS. 1 through 3, the pixel circuit may include electronic elements such as a switching thin film transistor (TFT) T1, a driving TFT T2 for driving the organic light-emitting device, and a capacitor Cst.

The organic light-emitting device may include a pixel electrode that is electrically connected to a source electrode or a drain electrode of the driving TFT T2, a counter electrode facing the pixel electrode, and an intermediate layer that is interposed between the pixel electrode and the counter electrode and that includes an organic emitting layer.

The organic light emitting layer may emit red, green, and blue light. The organic light-emitting device emitting red, green, and blue light forms a sub-pixel, and a plurality of sub-pixels may form a single unit pixel. Alternatively, an organic light-emitting device emitting red, green, blue, and white light may form a sub-pixel, and a plurality of sub-pixels may form a single unit pixel.

The circuit unit 120 may be disposed in the non-display area NDA, for example, at, at least, a side of the display unit 110. The circuit unit 120 may be electrically connected to a data driver and/or a gate driver, and the circuit unit 120 includes an embedded circuit that receives a signal from the data driver and/or the gate driver to drive the pixels P.

The embedded circuit may include a plurality of transistors 121 and 122 and/or a signal line. The plurality of transistors 121 and 122 may be formed when TFTs of the pixels P, for example, the switching TFT T1 and/or the driving TFT T2 are formed. A plurality of signal lines may be formed substantially simultaneously when forming lines of the pixels P.

The display substrate 100 including the display unit 110 and the circuit unit 120 may be exposed to an electrostatic discharge (ESD) that occurs during the manufacture of the display apparatus, and the ESD may damage or destroy elements formed on the display substrate 100, thus deteriorating electrical characteristics of those elements. For example, an ESD may be generated in a manufacturing process such as a thin film process using plasma, and the ESD may be applied to an insulating layer or a semiconductor layer that is structurally weak and cause a dielectric breakdown. Accordingly, the image quality of the display apparatus may be reduced.

The dielectric breakdown may easily occur in elements that are vulnerable to ESD, such as the transistors 121 and 122 and/or signal lines having a contact area in the embedded circuit. However, according to an exemplary embodiment of the present invention, the circuit unit 120 includes a damage inducing unit 130 that prevents damage to the embedded circuit due to ESD, and thus, the embedded circuit may be protected from being damaged by ESD. The damage inducing unit 130 may be disposed on a path through which an ESD is introduced into the embedded circuit and forcibly discharges the ESD, preventing the ESD from proceeding along lines and protecting the elements of the embedded circuit from the ESD.

Referring to FIGS. 2 and 3, the damage inducing unit 130 may be formed on a line 125 connected to the transistors 121 and 122. When the damage inducing unit 130 is not included, an EDS that has entered into the circuit unit 120 may proceed through the line 125 to the transistors 121 and 122 which are structurally vulnerable to ESD, damaging the transistors 121 and 122. However, according to an exemplary embodiment of the present invention, before the ESD reaches the transistors 121 and 122 along the line 125, the ESD may be forcibly discharged by the damage inducing unit 130. Thus, the ESD may be prevented from damaging the transistors 121 and 122 via the line 125.

The damage inducing unit 130 may be disposed at an edge of the circuit unit 120, away from the transistors 121 and 122 with the line 125 interposed between the damage inducing unit 130 and the transistors 121 and 122. For example, the transistors 121 and 122 may be connected to a first end of the line 125, and the damage inducing unit 130 may be formed at a second end of the line 125. According to positions of the transistors 121 and 122 and the line 125, the damage inducing unit 130 may be disposed on a first side of the circuit unit 120 away from the display unit 110 (refer to FIG. 2) or on a second side of the circuit unit 120 adjacent to the display unit 110 (refer to FIG. 3).

As illustrated in FIG. 2, when the transistor 121 may be formed in the circuit unit 120 and the line 125 extends toward the first side of the circuit unit 120, the damage inducing unit 130 may be disposed on the first side of the circuit unit 120, away from the transistor 121. According to this structure, an ESD introduced to the circuit unit 120 first damages the damage inducing unit 130 before reaching the transistor 121 disposed in the circuit unit 120, and thus, the transistor 121 may be safely protected from the ESD.

Alternatively, as illustrated in FIG. 3, when the transistor 122 may be formed in the circuit unit 120 and the line 125 extends toward the second side of the circuit unit 120, the damage inducing unit 130 may be disposed on the second side of the circuit unit 120, away from the transistor 122 and adjacent to the circuit unit 120. According to this structure, an ESD introduced from the display unit 110 first damages the damage inducing unit 130 before reaching the transistor 122 that is disposed in the circuit unit 120, and thus, the transistor 122 may be safely protected from the ESD.

The damage inducing unit 130 is connected to the transistors 121 and 122 via the line 125, but exemplary embodiments of the present invention are not limited thereto. Alternatively, the damage inducing unit 130 may be connected via the line 125 to a signal line unit that may include a contact area. Alternatively, the damage inducing unit 130 may be connected via the line 125 to the transistors 121 and 122 and the signal line unit that may each include a contact area.

While the damage inducing unit 130 is disposed on the first side or the second side of the circuit unit 120 in FIGS. 2 and 3, exemplary embodiments of the present invention are not limited thereto. Alternatively, the damage inducing unit 130 may be disposed both on the first and second sides of the circuit unit 120.

Figure 4:
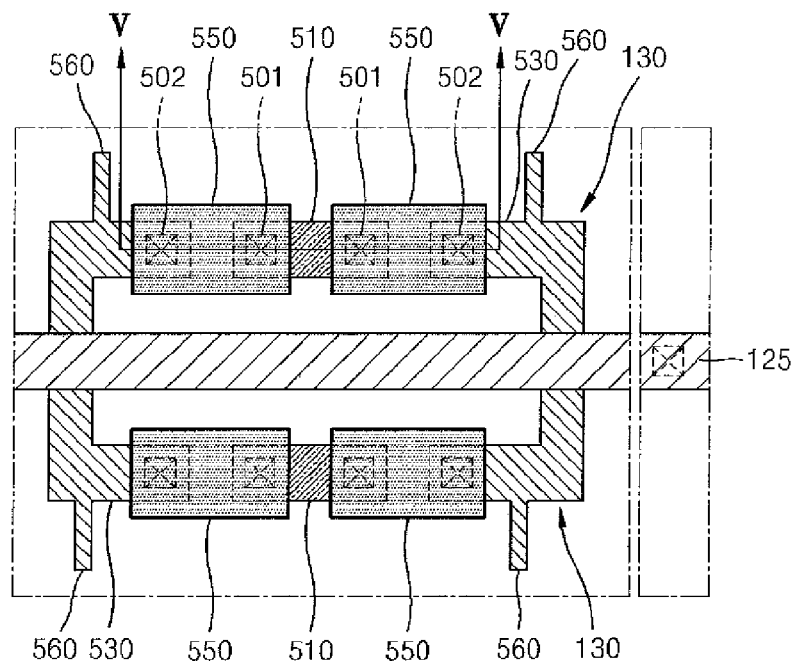
FIG. 4 is a top view illustrating a damage inducing unit illustrated in FIGS. 2 and 3, according to an exemplary embodiment of the present invention.
Figure 5:
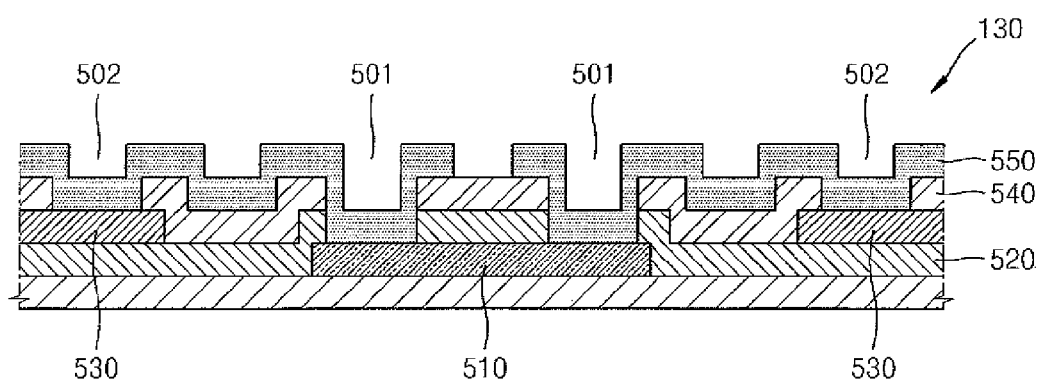
FIG. 5 is a cross-sectional view taken along line V-V of FIG. 4, according to an exemplary embodiment of the present invention.
Figure 6:
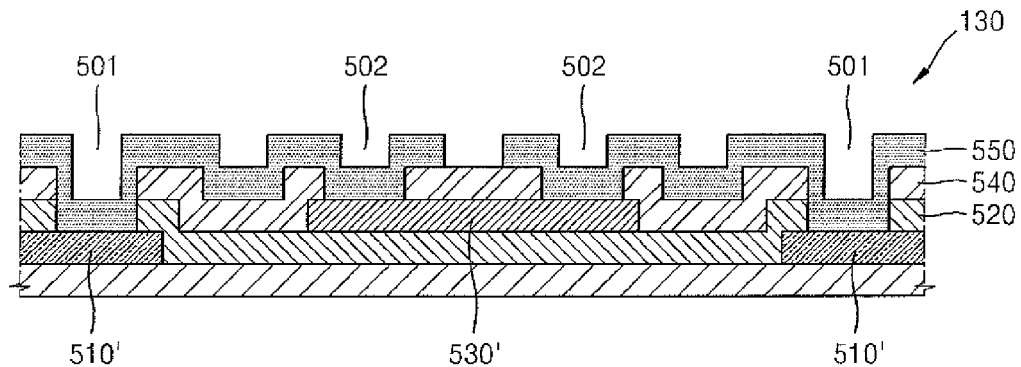
FIG. 6 is a cross-sectional view taken along line V-V of FIG. 4, according to an exemplary embodiment of the present invention.

FIG. 4 is a top view illustrating a damage inducing unit 130 illustrated in FIGS. 2 and 3, according to an exemplary embodiment of the present invention. FIG. 5 is a cross-sectional view taken along line V-V of FIG. 4, according to an exemplary embodiment of the present invention. FIG. 6 is a cross-sectional view taken along line V-V of FIG. 4, according to an exemplary embodiment of the present invention.

Referring to FIG. 4, the damage inducing units 130 may be disposed at both sides of the line 125 along a direction substantially perpendicular to a length direction of the line 125 with the line 125 interposed therebetween. The damage inducing unit 130 is configured with a contact area for discharging an ESD, thereby to dissipate the ESD before the ESD affects elements included in an embedded circuit. As such, after damaging the contract area of the damage inducing unit 130, the ESD may dissipate and disappear, and thus, a driving signal may be sent to the display unit 110 via the line 125 without interference by the ESD.

The contact area of the damage inducing unit 130 may include a plurality of stacked conductive layers with an insulating layer therebetween. The stacked conductive layers are connected to one another through contact holes of the insulating layer. A first conductive layer 510 and a third conductive layer 550 may be connected to each other via a contact hole of an insulating layer, forming a first contact area 501. A second conductive layer 530 and a third conductive layer 550 may be connected to each other via a contact hole of an insulating layer, forming a second contact area 502. The first conductive layer 510, the second conductive layer 530, and the third conductive layer 550 each may include a metal such as molybdenum (Mo).

The damage inducing unit 130 may include a protrusion 560 adjacent to the contact areas 501 and 502. The protrusion 560 may function like a lightening rod that leads an ESD, which is introduced into the embedded circuit via various paths and in various directions, to the damage inducing unit 130.

As shown in FIG. 4, while the line 125 and the second conductive layer 530 are formed on the same layer, exemplary embodiments of the present invention are not limited thereto. Alternatively, the line 125 may be formed on the same layer as the first conductive layer 510.

While the protrusion 560 is formed on the same layer as the second conductive layer 530 as shown in FIG. 4, exemplary embodiments of the present invention are not limited thereto. Alternatively, the protrusion 560 may be formed on the same layer as the first conductive layer 510, the second conductive layer 530, and/or the third conductive layer 550.

Referring to FIG. 5, the damage inducing unit 130 includes the first conductive layer 510, the second conductive layer 530, and the third conductive layer 550. A first insulating layer 520 may be formed between the first and second conductive layers 510 and 530, and a second insulating layer 540 may be formed between the second and third conductive layers 530 and 550.

The first conductive layer 510 may be connected to the third conductive layer 550 via a contact hole that passes through the first and second insulating layers 520 and 540 formed on the first conductive layers 510, forming the first contact area 501. The second conductive layer 530 is formed in a portion different from where the first conductive layer 510 is formed. The second conductive layer 530 does not overlap the first conductive layer 510. The second conductive layer 530 may be connected to the third conductive layer 550 via a contact hole that passes through the second insulating layer 540 formed on the second conductive layer 530, forming the second contact area 502.

As shown in FIG. 5, the first conductive layer 510 is formed between two adjacent second conductive layers 530. However, exemplary embodiments of the present invention are not limited thereto. As illustrated in FIG. 6, first conductive layers 510' may be formed on two opposite sides, respectively, of a second conductive layer 530'. In other words, the second conductive layer 530' may be positioned between the second conductive layers 530'.

According to an exemplary embodiment of the present invention, the first conductive layer 510' may be connected to the third conductive layer 550 via a contact hole that passes through the first and second insulating layers 520 and 540 formed on the first conductive layer 510', forming a first contact area 501. The second conductive layer 530' is formed in a portion different from where the first conductive layer 510' is formed. The second conductive layer 530' does not overlap the first conductive layer 510'. The second conductive layer 530' may be connected to the third conductive layer 550 via a contact hole that passes through the second insulating layer 540 formed on the second conductive layer 530', forming a second contact area 502.

The first conductive layer 510 or 510', the second conductive layer 530 or 530', and the third conductive layer 550 of the damage inducing unit 130 may be manufactured together with a TFT included in a pixel P, for example, when the switching TFT T1 and the driving TFT T2 are manufactured. Accordingly, one of the first conductive layer 510 or 510' and the second conductive layer 530 or 530' may be formed on the same layer as a gate electrode of the driving TFT T2, and the other one may be formed on the same layer as a gate electrode of the switching TFT T1. One of the first conductive layer 510 or 510' and the second conductive layer 530 or 530' may include the same material as the gate electrode of the driving TFT T2, and the other may include the same material as the gate electrode of the switching TFT T1.

FIGS. 7A through 7F are views illustrating a method of manufacturing a display apparatus according to an exemplary embodiment of the present invention.

Figure 7A:
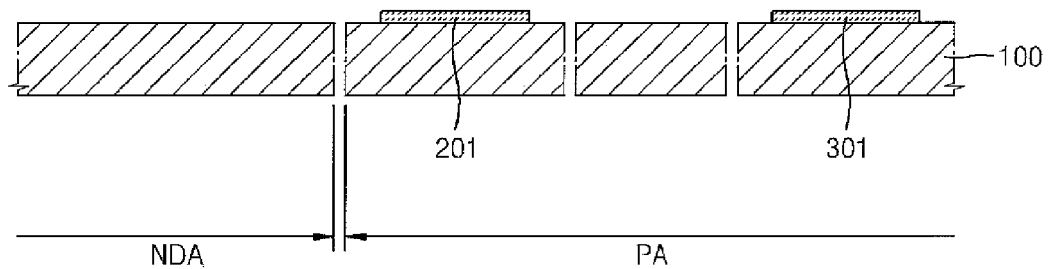
FIGS. 7A through 7F are views illustrating a method of manufacturing a display apparatus according to an exemplary embodiment of the present invention.

Referring to FIG. 7A, first and second active layers 201 and 301 are formed in a pixel area PA of a display substrate 100 corresponding to a pixel P. The first and second active layers 201 and 301 may include amorphous silicon, crystalline silicon, or an oxide semiconductor.

Figure 7B:
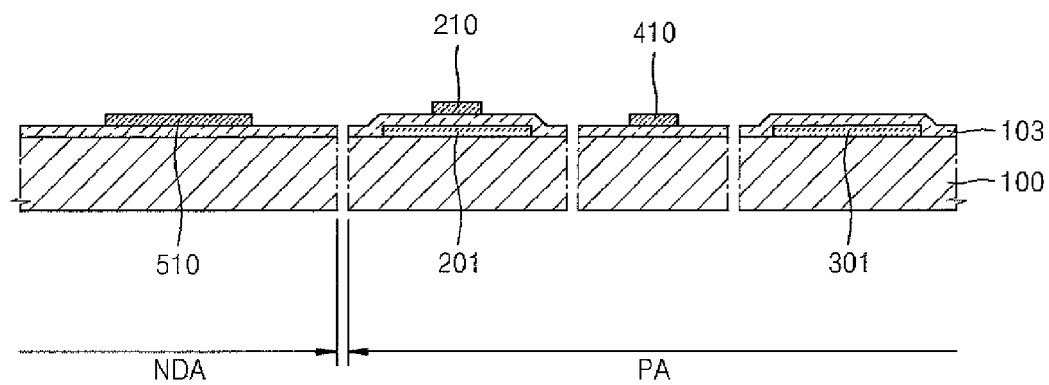

Referring to FIG. 7B, an insulating layer 103 may be formed on the display substrate 100 and covers the first and second active layers 201 and 301. A conductive metal layer such as molybdenum (Mo) may be formed on the insulating layer 103. A portion of the conductive metal layer may be etched, forming a first gate electrode 210 and a first capacitor electrode 410 in the pixel area PA and a first conductive layer 510 in a non-display area NDA corresponding to a circuit unit 120. The first gate electrode 210, the first capacitor electrode 410, and the first conductive layer 510 are formed in substantially the same process, and are thus formed on substantially the same layer and include substantially the same material.

Figure 7C:
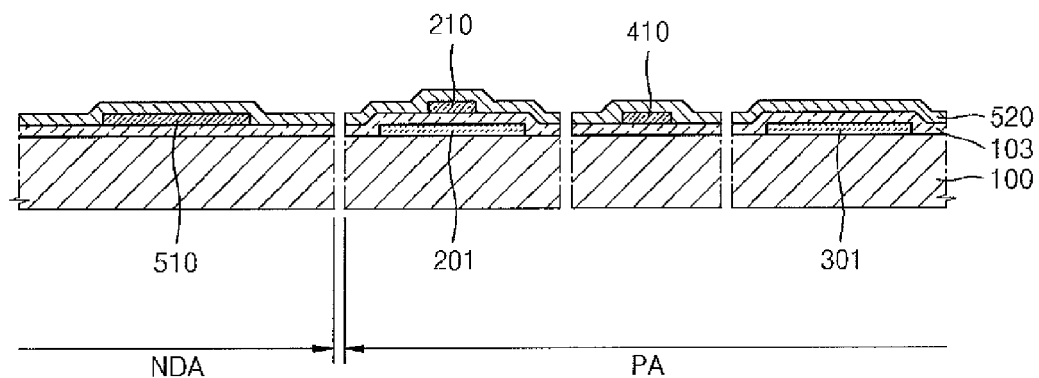

Referring to FIG. 7C, a first insulating layer 520 may be formed on the display substrate 100 and covers the first gate electrode 210, the first capacitor electrode 410, and the first conductive layer 510.

Figure 7D:
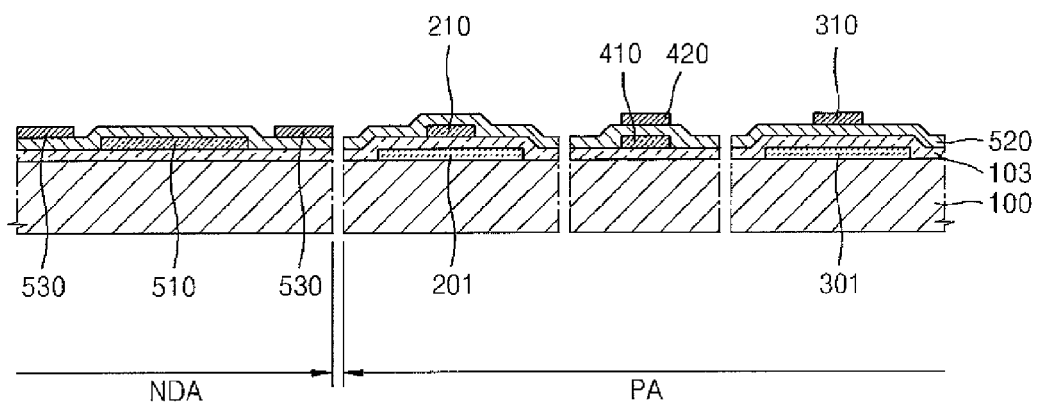

Referring to FIG. 7D, a conductive metal layer such as molybdenum (Mo) may be formed on the first insulating layer 520. A portion of the conductive metal layer may be etched, forming a second gate electrode 310 and a second capacitor electrode 420 in a pixel area PA and a second conductive layer 530 in the non-display area NDA. The second capacitor electrode 420 may face the first capacitor electrode 410, with the first insulating layer 520 formed between the first and second capacitor electrodes 410 and 420. The second conductive layer 530 might not overlap the first conductive layer 510. The second gate electrode 310, the second capacitor electrode 420, and the second conductive layer 530 are formed in the same operation, and may thus be formed on the same layer and include the same material.

Figure 7E:
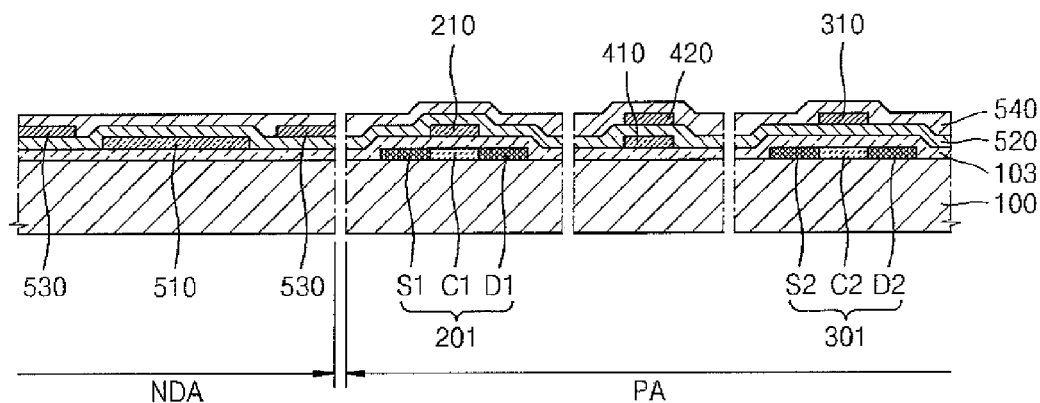

Referring to FIG. 7E, the first active layer 201 may be doped with high-density impurities by using the first gate electrode 210 as a self-align mask, forming a channel area C1 in a middle portion of the first active layer 201 and a source area S1 and a drain area D1 at two opposite sides of the channel area C1. Likewise, the second active layer 301 may be doped with high-density impurities by using the second gate electrode 310 as a self-align mask, forming a channel area C2 in a middle portion of the second active layer 301 and a source area S2 and a drain area D2 at two opposite sides of the channel area C2.

A second insulating layer 540 is formed on the display substrate 100 and covers the second capacitor electrode 420 and the second gate electrode 310.

Figure 7F:
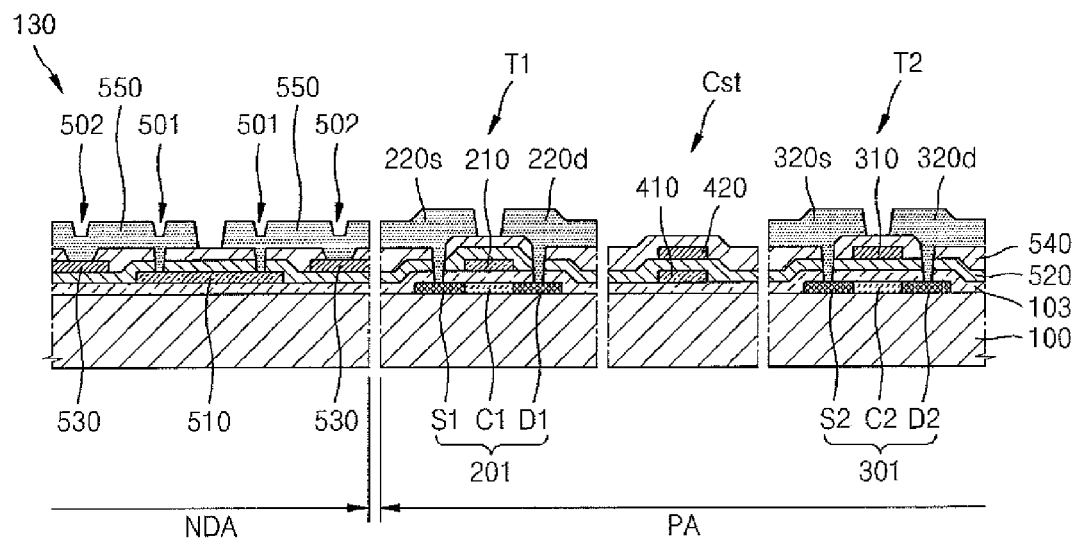

Referring to FIG. 7F, contact holes pass through the first and second insulating layers 520 and 540 and the second insulating layer 540. A conductive metal layer is formed on the second insulating layer 540. By partially etching the conductive metal layer, first and second source electrodes 220S and 320S and first and second drain electrodes 220D and 320D are formed in the pixel area PA, and a third conductive layer 550 is formed in the non-display area NDA. The first and second source electrodes 220S and 320S, the first and second drain electrodes 220D and 320D, and the third conductive layer 550 are formed in the same process, and may thus be formed on the same layer and include the same material.

The first source electrode 220S and the first drain electrode 220D are respectively connected to the source area S1 and the drain area D1 of the first active layer 201, and the second source electrode 320S and the second drain electrode 320D are respectively connected to the source area S2 and the drain area D2 of the second active layer 301. The third conductive layer 550 contacts the first conductive layer 510 through the contact hole that passes through the first and second insulating layers 520 and 540, forming a first contact area 501. The third conductive layer 550 contacts the second conductive layer 530 through the contact hole that passes through the second insulating layer 540, forming a second contact area 502.

The damage inducing unit 130 may be formed substantially simultaneously with the switching TFT T1, the driving TFT T2, and the capacitor Cst, and thus, no additional process of forming the damage inducing unit 130 is necessary. Accordingly, the manufacturing costs and time may be reduced. The damage inducing unit 130 may be damaged by ESD generated upon the manufacture of the display apparatus, and the embedded circuit may be prevented from being damaged.

According to an exemplary embodiment of the present invention, a display apparatus may be protected from ESD which may occur during or after the manufacture of the display apparatus.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A display apparatus, comprising:
a display unit including a thin film transistor (TFT) and a display device that is electrically connected to the TFT; and
a circuit unit disposed at a side of the display unit and including a driving device or a signal line unit,
wherein the circuit unit includes a damage inducing unit that is electrically coupled to a conductor in the circuit unit, the damage inducing unit configured with a contact area for discharging an electrostatic discharge (ESD) introduced into the circuit unit,
wherein the damage inducing unit includes a plurality of stacked conductive layers and an insulating layer between the plurality of conductive layers, the insulating layer having a contact hole, and
wherein the plurality of conductive layers are connected to one another via the contact hole to form the contact area.

2. The display apparatus of claim 1, wherein the driving device or the signal line unit comprises the contact area.

3. The display apparatus of claim 1, wherein the damage inducing unit is disposed at an edge of the circuit unit.

4. The display apparatus of claim 1, wherein some of the plurality of conductive layers are formed on the same layer as a gate electrode of the TFT.

5. The display apparatus of claim 1, wherein the TFT comprises a driving TFT configured to drive the display device and a switching TFT,
wherein one of the plurality of conductive layers comprises the same material as a gate electrode of the driving TFT and another one of the plurality of conductive layers comprises the same material as a gate electrode of the switching TFT.

6. The display apparatus of claim 1, wherein one of the plurality of the conductive layers comprises the same material as a source electrode or a drain electrode of the TFT.

7. The display apparatus of claim 1, wherein the damage inducing unit further comprises a protrusion configured to guide the ESD to the damage inducing unit.

8. The display apparatus of claim 1, wherein the damage inducing unit comprises a first damage inducing unit and a second damage inducing unit that are respectively disposed on both sides of the conductor in a direction substantially perpendicular to a length direction of the conductor, wherein the conductor is disposed between the first and second inducing units.

9. A display apparatus, comprising:
a display unit including a thin film transistor (TFT) and a display device that is electrically connected to the TFT; and
a circuit unit disposed at a side of the display unit and including a driving device or a signal line unit.
wherein the circuit unit includes a damage inducing unit that is electrically coupled to a conductor in the circuit unit, the damage inducing unit configured with a contact area for discharging an electrostatic discharge (ESD) introduced into the circuit unit,
wherein the damage inducing unit comprises:
a first conductive layer;
a second conductive layer formed on the first conductive layer;
a first insulating layer interposed between the first conductive layer and the second conductive layer;
a third conductive layer formed on the second conductive layer;
a second insulating layer interposed between the second conductive layer and the third conductive layer,
wherein the third conductive layer is connected to the first conductive layer and the second conductive layer via contact holes to form the contact area.

10. The display apparatus of claim 9, wherein the damage inducing unit is connected to the conductor,
wherein the conductor is formed on the same layer as the first conductive layer or the second conductive layer.

11. The display apparatus of claim 9, wherein the damage inducing unit further comprises a protrusion that is formed on the same layer as one of the first through third conductive layers, the protrusion configured to guide the ESD to the damage inducing unit.

12. A display apparatus, comprising:
a display unit that comprises a switching thin film transistor (TFT), a driving TFT, and an organic display device electrically connected to the driving TFT; and
a circuit unit disposed adjacent to the display unit, the circuit unit including a driving device or a signal line unit,
wherein the circuit unit includes a damage inducing unit configured with a contact area for discharging an electrostatic discharge (ESD) introduced into the circuit unit,
wherein the damage inducing unit includes a plurality of stacked conductive layers and an insulating layer between the plurality of conductive layers, the insulating layer having a contact hole, and
wherein the plurality of conductive layers are connected to one another via the contact hole to form the contact area.

13. The display apparatus of claim 12, wherein the driving device or the signal line unit includes the contact area.

14. The display apparatus of claim 13, wherein the contact area of the driving device or the signal line unit is disposed in the circuit unit, and the damage inducing unit is disposed at an edge of the circuit unit.

15. The display apparatus of claim 12, wherein the damage inducing unit is disposed at a first side positioned adjacent to the display unit and/or a second side positioned away from the display unit.

16. The display apparatus of claim 12, wherein the damage inducing unit further includes a protrusion configured to guide the ESD to the damage inducing unit.

17. The display apparatus of claim 12, wherein the contact area includes a first contact area and a second contact area, and the insulating layer include a first insulating layer and a second insulating layer,
wherein the first insulating layer is formed on a first conductive layer of the plurality of conductive layers,
wherein a second conductive layer of the plurality of conductive layers is formed on the first insulating layer,
wherein the second insulating layer is formed on the second conductive Layer,
wherein a third conductive layer of the plurality of conductive layers is formed on the second insulating layer, and
wherein the third conductive layer is connected to the first conductive layer via a contact hole to form the first contact area, and the third conductive layer is connected to the second conductive layer via a contact hole to form the second contact area.

18. The display apparatus of claim 17, wherein one of the first and second conductive layers is formed on the same layer as a gate electrode of the driving TFT, and the other of the first and second conductive layers is formed on the same layer as a gate electrode of the switching TFT.

19. The display apparatus of claim 12, wherein some of the plurality of conductive layers include a metal.

* * * * *